United States Patent [19]

DeWitt

[11] 3,727,147

[45] Apr. 10, 1973

[54] BAND-PASS FILTER

[75] Inventor: Kenneth I. DeWitt, Chalfont, Pa.

[73] Assignee: Sonex, Inc., Philadelphia, Pa.

[22] Filed: Apr. 21, 1971

[21] Appl. No.: 136,084

[52] U.S. Cl. ......................330/84, 330/107, 330/126
[51] Int. Cl. ................................................H03f 3/68
[58] Field of Search ......................330/30 R, 84, 107, 330/109, 126

[56] References Cited

UNITED STATES PATENTS 2,709,206 5/1955 Ferguson ..........................330/126 X

OTHER PUBLICATIONS

Minuscin, "Active Filter Design Uses Basic Language" Electronic Design 5, Mar. 1, 1970, pp. 83, 85.

*Primary Examiner*—Roy Lake
*Assistant Examiner*—James B. Mullins
*Attorney*—Caesar, Rivise, Bernstein & Cohen

[57] ABSTRACT

A class of band-pass filters are provided, each of which comprises a plurality of low pass active filters. Each of the filters has related resonating frequency and damping characteristics. The resonating frequency and damping characteristics for each of the filters causes all of the poles of the filters to be along a line parallel to the outputs of the filter so that the output signals of the filters are summed with alternate ones of the filters having the output signal inverted with respect to the other of the filters.

4 Claims, 4 Drawing Figures

INVENTOR
KENNETH I. DE WITT

BY

Caesar, Rivise, Bernstein & Cohen
ATTORNEYS.

INVENTOR
KENNETH I. DE WITT
BY
Caesar, Rivise, Bernstein & Cohen
ATTORNEYS.

BAND-PASS FILTER

An ideal band-pass filter is one which exhibits uniform attenuation and delay of all frequency components within the pass band with very high attenuation (no transmission) outside the pass band. However in the real world of linear phase networks, it is substantially impossible to build a stable lumped element filter having the ideal characteristics defined above.

In the March, 1964 Proceedings of the IEEE, Dr. Robert M. Lerner wrote an article entitled "Band-Pass Filters with Linear Phases" (pages 249 to 268) in which a technique was disclosed for developing a class of linear phase band-pass filters. The article deals with a set of techniques which were developed to permit the simultaneous realization of flat band-pass transmission and linear phase. Outside the pass band, the attenuation skirts are extremely steep.

The technique disclosed in the article utilized a lattice network of either parallel or series tuned LC circuits. That is, the technique utilized a series of band-pass tuned filters.

The techniques disclosed within the article are theoretically excellent until the practicalities of real components are used. That is, the actual coils used have resistance and the transformers required to couple in and out of the filter have shunt capacitance and their own resonance points. Also, the number of poles which are often required to obtain the desired performance, made the tuning of the filter on a production basis nearly impossible.

It is, therefore, an object of this invention to overcome the aforementioned disadvantages.

Another object of the invention is to provide a new and improved band-pass filter with substantially linear phase within the pass band.

Yet another object of the invention is to provide a new and improved band-pass filter which is constructed entirely out of active networks.

Yet another object of this invention is to provide a new and improved band-pass filter which is constructed out of stock parts and utilizes easily available tolerances on capacitors and resistors.

These and other objects of the invention are achieved by providing a class of band-pass filters, each of which comprises a plurality of low pass active filters. Each of the filters has related resonating frequency and damping characteristics. The resonating frequency and damping characteristics for each of the filters cause all of the poles of the filters to lie along a line parallel to the imaginary axis of the S plane. Means are provided which are connected to the output of the filters so that the output signals of the filters are summed with alternate ones of the filters having the output signal inverted with respect to the other of the filters.

Other objects and many of the attendant advantages of this invention will be readily appreciated as the same becomes better understood by reference to the following detailed description when considered in connection with the accompanying drawings wherein.

Referring now in greater detail to the various figures of the drawing wherein like reference numerals refer to like parts, a band-pass filter embodying the invention is shown generally at 20 in FIG. 1.

Figure 1:
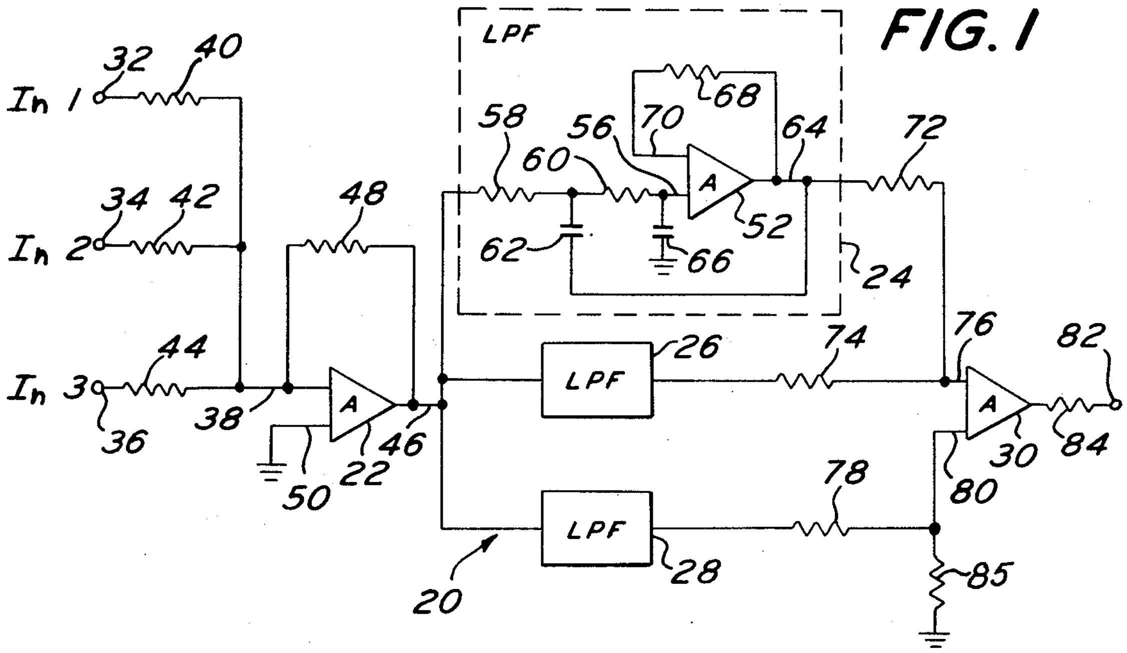
FIG. 1 is a schematic block diagram of a three pole band-pass filter embodying the invention.

Band-pass filter 20 basically comprises an input amplifier 22, three low pass filters 24, 26 and 28 and an output amplifier 30.

The band-pass filter 20 includes three input terminals 32, 34 and 36 which are, respectively, labeled In 1, In 2, and In 3. Terminal 32 is connected to a first input line 38 to amplifier 22 via a resistor 40. Terminal 34 is connected to input line 38 via resistor 42 and input terminal 36 is connected to input line 38 via resistor 44. Amplifier 22 includes an output line 46 which is connected to input line 38 via resistor 48. The remaining input line 50 of amplifier 22 is connected to ground. Output line 46 of amplifier 22 is connected to the input line of each of the low pass filters 24, 26 and 28.

The low pass filters 24, 26 and 28 are similarly constructed with only the values of the resistors and capacitors used in the low pass filter being changes. As can be seen by the amplifier 52 provided in the low pass filter 24, each of the low pass filters 24, 26 and 28 are active. Each of the amplifiers 22, 30 and 52 which are used in the circuit are preferably comprised of a 741 operational amplifier. The input line to the low pass filter 24 is connected therein to the first input line 56 of the amplifier 52 via a pair of resistors 58 and 60 which are connected serially. A capacitor 62 is connected between output line 64 of amplifier 52 and the junction between resistors 58 and 60. A second capacitor 66 is connected between ground and input line 56 of the amplifier 52. The output line 64 of amplifier 52 is connected via a resistor 68 to input line 70 of amplifier 52.

Low pass filters 24 and 26 are connected via resistors 72 and 74, respectively, to input line 76 of amplifier 30. Low pass filter 28 is connected via resistor 78 to input line 80 of amplifier 30. The output of amplifier 30 is connected to output terminal 82 via an output resistor 84. Input line 80 of amplifier 30 is also connected to ground via resistor 85 which acts in combination with resistor 78 as a voltage divider.

The plurality of input terminals 32, 34 and 36 are provided so that various gains can be achieved by the band-pass filter circuit. That is, resistors 40, 42 and 44 are of different component values and, therefore, the gain of the circuit is altered in accordance with the terminal 32, 34 or 36 to which an input signal is connected.

Amplifier 22, in addition to providing additional gain to the circuit, also provides a constantly low source impedance to the low pass filters 24, 26 and 28. The low pass filters 24, 26 and 28 represent the three poles of the band-pass filter. As seen therein, low pass filters 24 and 26 are each connected to input line 76 of the amplifier 30. Low pass filter 28 on the other hand is connected to input line 80 of amplifier 30. Since amplifier 30 is an operational amplifier which operates on a differential basis, the effect is to add the outputs of low pass filters 24 and 26 and subtract the value of low pass filter 28. The same effect could, of course, be achieved by providing an inverter between output line 46 of amplifier 22 and the input of low pass filter 28 and connecting the output of low pass filter 38 to input line 76 of amplifier 30.

As will hereinafter be seen, the class of band-pass filters which can be achieved by utilizing the teaching of this invention can require less or more poles to achieve the desired band-pass filter characteristics depending upon the requirements. For example, where a relatively narrow band-pass is required, only two poles may be required in which case it would be necessary to provide only low pass filters 26 and 28. Similarly, wherein more poles are required in order to provide a relatively large band pass, more poles would be required. This will be discussed in greater detail hereinafter.

The characteristics of the band-pass filter 20 shown in FIG. 1 are determined by the resistors 58 and 60 and capacitors 62 and 66 for each of the low pass filters 24, 26 and 28. Each of the filters are related so that the resonating frequency and damping characteristics of each of the filters which define the placement of poles on an S plane are so chosen that the poles for each of the filters lies on a line which is parallel to the imaginary axis of the S plane plot.

Figure 2:
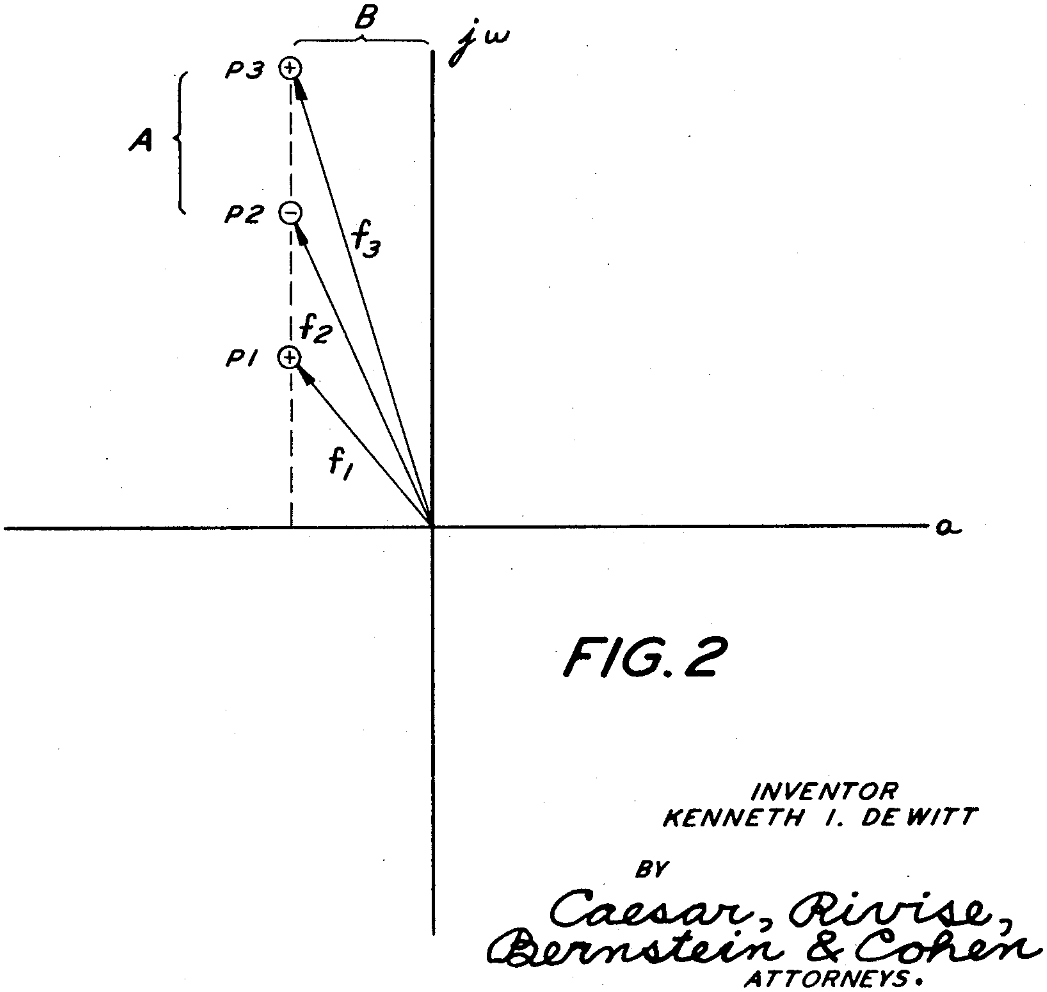
FIG. 2 is a graphical representation of the S plane plot for the filters shown in FIG. 1.

Referring to FIG. 2, an S plane plot of the poles represented by the low pass filters in FIG. 1 is shown. In FIG. 2, the a axis is the real axis with the $jw$ axis being the imaginary axis. The poles in the figure are labeled P1, P2 and P3 and are representative of low pass filters 26, 28 and 24, respectively.

As also seen in FIG. 2, each of the poles P1, P2 and P3 lie on a line which is parallel to the imaginary or $jw$ axis. Thus, pole P1 is representative of a low pass filter 26 which has a resonating frequency $f_1$ and a damping characteristic of the real distance between pole P1 and the $jw$ axis divided by frequency $f_1$. As seen in FIG. 2, each of the poles P1, P2 and P3 are spaced a distance B along the real axis from the $jw$ axis. Accordingly, the damping characteristics of poles P1, P2 and P3 are as follows:

Damping at P1 $= B/f_1$

Damping at P2 $= B/f_2$

Damping at P3 $= B/f_3$

For ease of reference, the damping characteristic is represented by the symbol "Z" hereinafter.

The general equation for a three pole filter with frequency and damping characteristics of $f_1$, $Z_1$, $f_2$, $Z_2$, $f_3$, $Z_3$ and gains of $K_1$, $K_2$ and $K_3$ is as follows:

EQUATION 1

$$F(S)=\frac{K_1}{\frac{S^2}{4\pi^2 f_1^2}+\frac{2Z_1}{2\pi f_1}S+1}-\frac{K_2}{\frac{S^2}{4\pi^2 f_2^2}+\frac{2Z_2}{2\pi f_2}S+1}+\frac{K_3}{\frac{S^2}{4\pi^2 f_3^2}+\frac{2Z_3}{2\pi f_3}S+1}$$

Since Z equals $B/f$, then

EQUATION 2

$$F(S)=\frac{K_1}{\frac{S^2}{4\pi^2 f_1^2}+\frac{B}{\pi f_1^2}S+1}-\frac{K_2}{\frac{S^2}{4\pi^2 f_2^2}+\frac{B}{\pi f_2^2}S+1}+\frac{K_3}{\frac{S^2}{4\pi^2 f_3}+\frac{B}{\pi f_3^2}S+1}$$

Equation 2 can then be rewritten in accordance with the center frequency of the pass band. That is, the center frequency of the pass band of the band-pass filter is labeled hereinafter "$f_c$." Thus, $f_1$ equals $f_c - A$, $f_2$ equals $f_c$ and $f_3$ equals $f_c + A$ where A is the distance between poles P2 and P3 and P2 and P1. Thus, for example, if a band-pass filter is desired with a center frequency of 1,000 cycles per second or 1,000 Hertz (Hz) with a pass band extending over 15 percent of the center frequency with an attenuation of less than −3 db, then the −3 db points would be at 1,075 Hz and 925 Hz. Accordingly, it can, therefore, be estimated that 100 Hz above and below the center frequency approximates the −6 db points. That is, the desired pass band characteristics of the band-pass filter require that the skirts of the amplitude output be at the −6 db points at 100 Hz above and below the center frequency ($f_c$).

In the S plane plot of FIG. 2, the outside poles P1 and P3 are taken at the −6 db points. Thus, the difference between poles P1 and P2 and P2 and P3 is 100 Hz. Having determined that the Equation 2 can be rewritten in terms of the center frequency, the following equation is derived:

EQUATION 3:

$$F(S)=\frac{K_1}{\frac{S^2}{4\pi^2(f_c-A)^2}+\frac{B}{\pi(f_c-A)^2}S+1}-\frac{K_2}{\frac{S^2}{4\pi^2(f_c)^2}+\frac{B}{\pi(f_c)^2}S+1}+\frac{K_3}{\frac{S^2}{4\pi^2(f_c+A)^2}+\frac{B}{\pi(f_c+A)^2}S+1}$$

Also, in view of the fact that in a three pole filter, there are twice as many positive poles as there are negative poles, it is necessary to compensate by adjusting the gains $K_1$, $K_2$ and $K_3$. That is, $K_1$ and $K_3$ must be one-half of $K_2$ so that the total of the gain factors is 0. Therefore, in Equation 3, $K_1 = 1$, $K_2 = 2$ and $K_3 = 1$.

In the example given above $f_c - A$ equals 900, $f_c + A$ equals 1,100 and $f_c$ equals 1,000. The numbers are inserted in Equation 3 and the points on a frequency vs. amplitude and phase plot can easily be calculated from the transfer equation for the filter. Where a computer is used, and the computer cannot handle complex conjugates, the computer can be programmed to calculate separately the real and imaginary parts of each of the three terms of Equation 3 and then add all of the real terms together and all of the imaginary terms together.

If the real total is $R_T$ and the imaginary total of the parts of the equation is $I_T$, then the amplitude of the output of the band-pass filter at any frequency is as follows:

Amplitude $= \sqrt{I_T^2 + R_T^2}$

Similarly, the phase shift at any frequency is as follows:

Phase Shift $= \tan^{-1}(I_T/R_T)$

The amplitude and phase shift characteristics of the equation are then plotted to determine whether or not the filter has ample phase linearity characteristics as well as the desired band-pass characteristics. If a three pole filter is not sufficient, a filter having more poles can then be developed in accordance with the general equation set forth above. The important characteristic of the class of band-pass filters made in accordance with this invention is that each of the poles must lie on the line parallel to the *jw* axis.

Where it has been determined that the number of poles which have been provided is satisfactory (i.e., the phase shift does not vary more than a decimal percentage in the pass band), the paramenters of the individual low pass filters can then be determined. For each of the filters, the resistances and capacitances must satisfy the following transfer function:

EQUATION 4

$$F(S) = 1/[S^2(R_1R_2C_1C_2) + S(R_1C_2 + R_2C_2) + 1]$$

In the above equation, $R_1$ equals the resistance of resistor 58, $R_2$ equals the resistance of resistor 60, $C_1$ equals the capacitance of capacitor 62 and $C_2$ equals the capacitance of capacitor 66. Resistor 68 in the low pass filters is normally taken in accordance with the sum of the resistance of resistors 58 and 60 so that if the resistors 58 and 60 have a total resistance of approximately 20 Kohm, the resistor 68 is made approximately the same.

In view of the fact that there are a substantially infinite number of combinations of resistances and capacitances that would satisfy the transfer function set forth in Equation 4, the resistors 58 and 60 are first picked in accordance with readily available resistors and the capacitances for capacitors 62 and 66 are then determined in accordance with the equations as written with the values for the resistors 58 and 60 inserted in the equation.

Where greater phase linearity is required than is possible with the two or three pole filter, the number of poles in the filter can be increased. Accordingly, additional low pass filters are utilized in the band-pass filter.

Figure 3:
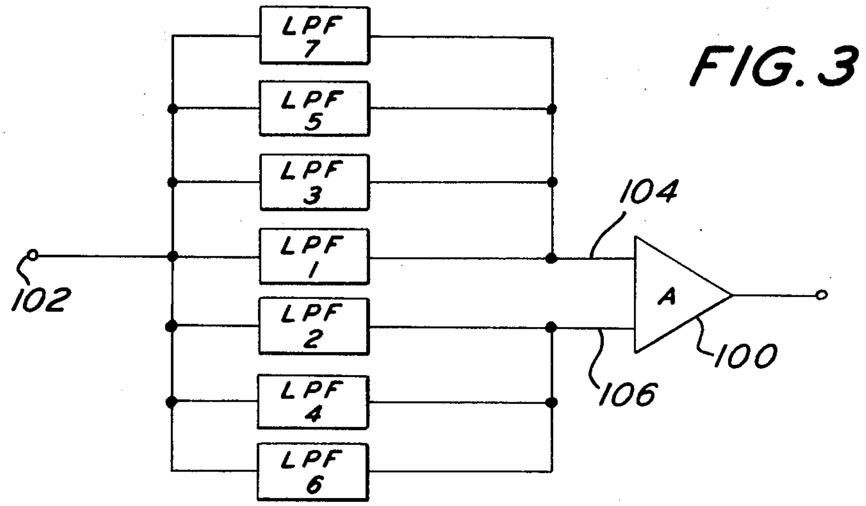
FIG. 3 is a schematic block diagram representative of the manner in which the number of poles may be increased in band-pass filters of the class described.

Referring to FIG. 3, the general order of adding low pass filters to the band-pass filter is shown therein. As set forth above, where a two pole band-pass filter is provided, two low pass filters are provided in combination with an output amplifier 100. Input terminal 102 shown in FIG. 3 is connected to each of the low pass filters LPF 1 and LPF 2 shown therein with the outputs of LPF 1 and LPF 2 connected to inputs 104 and 106, respectively, of amplifier 100. As the number of pole requirements increases, the low pass filters are added in parallel to the low pass filters LPF 1 and LPF 2 in the order shown in FIG. 3. For example, LPF 3 is added in parallel to LPF 1, LPF 4 is added in parallel of LPF 2, LPF 5 is added in parallel to LPF 1 and LPF 3, LPF 6 is added in parallel to LPF 2 and LPF 4, LPF 7 is added in parallel to LPF 1, LPF 3 and LPF 5 and so on as the number of poles is increased.

The characteristics of the low pass filters are always so chosen that the poles fall on a line which is parallel to the imaginary or *jw* axis in the S plane. Again, it should be noted that since there is a summing of the inverted amplitude of the alternate poles, each of the odd numbered low pass filters (LPF 1, LPF 3 . . . ) are connected to the input 104 of amplifier 100 with the even numbered low pass filters (LPF 2, LPF 4 . . . ) being connected to input line 106 of amplifier 100. As set forth above, since the amplifier 100 is a differential amplifier, it has the effect of adding the inverted output of the alternating low pass filters to the non-inverted output of the other low pass filters.

Figure 4:
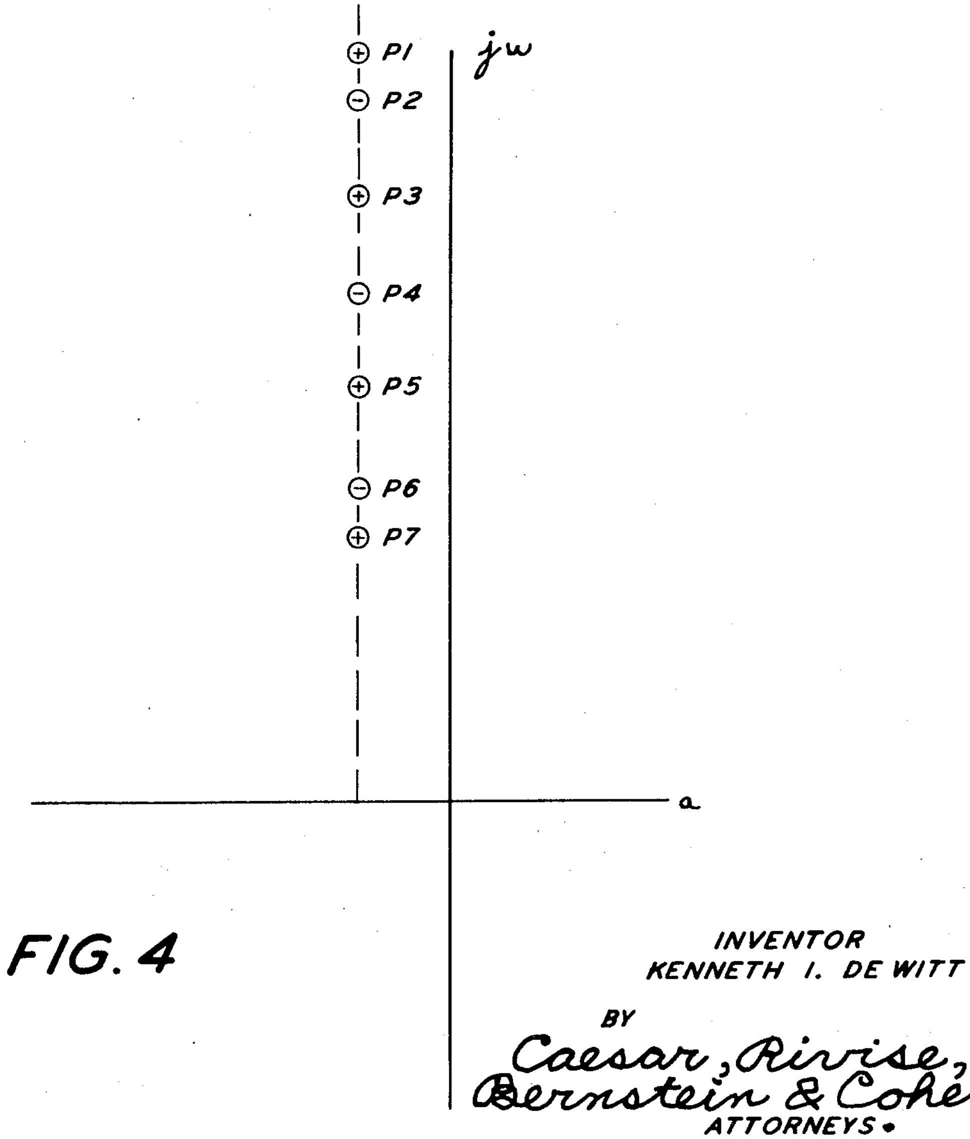
FIG. 4 is a diagrammatic representation of an S plane plot showing the positioning of the poles for the use of a seven pole low pass filter of the type shown in FIG. 3.

Referring to FIG. 4, it can be seen how the seven poles of a seven pole active filter are determined. It has been found that above three poles, the outside poles should be half the distance from the next adjacent poles as are the remaining poles. Accordingly, poles P1 through P7 are so spaced that P1 and P2 are the same distance from each other as are poles P6 and P7 which are each one-half the distance of the distances between poles P2 through P6. Where the characteristics of the band-pass filter are the same as those shown in the previous examples where the center frequency ($f_c$) of the pass band is 1,000 Hz and the –6 db points are approximately 900 and 1,100 Hz, $f_1$ through $f_7$ are taken at frequencies of 900, 920, 960, 1,000, 1,040, 1,080 and 1,100 Hz, respectively. Thus, poles P1 and P2 are spaced 20 Hz as are poles P6 and P7. The remaining poles P2 through P6 are, respectively, spaced from each other by 40 Hz. Similarly, the line upon which poles P1 through P7 lie is spaced from the imaginary axis by 40 Hz in the real direction.

The equation for the seven pole filter would then be as follows with there being seven terms of the transfer function with alternating components having alternating signs:

EQUATION 5

$$F(S) = \frac{K_1}{\frac{S^2}{4\pi^2 f_1^2} + \frac{B}{\pi f_1^2}S + 1} - \frac{K_2}{\frac{S^2}{4\pi^2 f_2^2} + \frac{B}{\pi f_2^2}S + 1} + \frac{K_3}{\frac{S^2}{4\pi^2 f_3^2} + \frac{B}{\pi f_3^2}S + 1} - \frac{K_4}{\frac{S^2}{4\pi^2 f_3^2} + \frac{B}{\pi f_3^2}S + 1} + \frac{K_5}{\frac{S^2}{4\pi^2 f_5^2} + \frac{B}{\pi f_5^2}S + 1} - \frac{K_6}{\frac{S^2}{4\pi^2 f_6^2} + \frac{B}{\pi f_6^2}S + 1} + \frac{K_7}{\frac{S^2}{4\pi^2 f_7^2} + \frac{B}{\pi f_7^2}S + 1}$$

The frequencies $f_1$ through $f_7$ determined above for the seven pole filter would be used in Equation 5 for determining the characteristic of the band-pass filter of seven poles. The gain factors ($K_1$ through $K_7$) would be as follows: $K_1$ and $K_7$ would each be one-half of the gains $K_2$ through $K_6$. Thus, the sum of the gains is 0 with the positive gains equaling the negative gains. As set forth above, wherever more than three poles are used, the outside poles are spaced approximately one-half the distance from the next outside poles as are the remaining poles in the straight line parallel to the *jw* axis. Accordingly, where an odd number of poles are utilized, the gain factors ($K_1$ . . . ) for the outside poles are one-half so that the sum of the gains is 0 in the transfer function. Where an even number of poles are used, the center frequency is taken between the center two poles and all of the gains utilized in the transfer function are equal with the exception of the end poles which remain one-half the gain of the remaining poles thereby causing the gains to cancel each other out. It should be noted that Equations 2 and 5 are identical in the first three terms. For each pole used, a term of the equation is added with the frequency characteristic of the pole being inserted therein.

It can, therefore, be seen that a new and improved class of filters has been provided. A unique feature of the invention is the use of low pass active filter elements to obtain band-pass characteristics. The band-pass filters enable the group delay gains to be independently changed without affecting amplitude characteristics. Another feature of the invention is the ability of the band-pass filter to be designed for maximum rejection of any given frequency without the addition of extra poles. Moreover, with the use of only two poles, a high level of performance can be provided which has not heretofore been possible with prior band-pass filters.

Where only two poles are used, the spacing between the poles and the spacing between the line upon which the poles fall and the $jw$ axis are substantially equal in the S plane. The center frequency is, of course, taken between the two poles with the two poles taken at the −6 db points. Accordingly, for the example given above where the center frequency is 1,000 Hz, the frequencies $f_1$ and $f_2$ for a two pole filter are 900 and 1,100 Hz. Of course, the use of only two poles does not provide the linearity of phase across the pass band which is possible by the use of more poles.

It has been found that even when using as few as two poles, band passes as wide as 15 percent of the center frequency are obtainable with skirts as steep as 100 db per octave.

It has also been found that the characteristics or design features of the filter include the following:

1. The closer the poles are together, the longer the group delay.

2. The closer the poles are together, the closer they must be to the imaginary axis and, thus, the smaller the damping factor required on each pole. However, it should be noted that for low damping factors, it is difficult to construct the filter elements.

3. The construction of the filter with evenly spaced poles causes constant group delay across the pass band. However, if it is desired to have a variation in the group delay across the pass band, then it is only necessary to suitably vary the spacing between the poles and, thus, varied group delay characteristics may be realized with minimum impact on the gain characteristic. A preferred use of this characteristic is in the design of a filter for compensation of phone lines.

4. It is also possible to deliberately design the band-pass filter to have higher rejection of either high or low frequencies but only at the expense of the other. For example, deliberately mismatching the gains, it is possible to have higher db rejection at the high frequencies and lower db rejection at the low frequencies and vice versa.

Without further elaboration, the foregoing will so fully illustrate my invention that others may, by applying current or future knowledge, readily adapt the same for use under various conditions of service.

What is claimed as the invention is:

1. A band-pass filter comprising a plurality of low pass active filters, each of said filters having related resonating frequency and damping characteristics, said resonating frequency and damping characteristics for each of said filters causing all of the poles of said filters to be along a line parallel to the imaginary axis of the S plane, means connected to the outputs of said filters so that the output signals of said filters are (summed with) combined, the gains of alternate ones of said filters (having the output signal) being inverted with respect to the other of said filters when combined.

2. A band-pass filter comprising a plurality of low pass active filters, each of said filters having related resonating frequency and damping characteristics, said resonating frequency and damping characteristics for each of said filters causing all of the poles of said filters to be along a line parallel to the imaginary axis of the S Plane, means connected to the outputs of said filters so that the output signals of said filters are combined, said means connected to the outputs of said filters comprising an operational amplifier, at least one of said low pass filters being connected to a first input of said operational amplifier and the remaining ones of said low pass filters being connected to the other input of said operational amplifier so that the outputs of said filters connected to the first input are effectively inverted with respect to the outputs of said filters connected to the second input of said operational amplifier.

3. A band-pass filter comprising a plurality of active filters, each of said filters having related resonating frequency and damping characteristics, said resonating frequency and damping characteristics for each of said filters causing all of the poles of said filters to be along a line parallel to the imaginary axis of the S plane, means connected to the outputs of said filters so that the output signals of said filters are combined, with alternate ones of said filters having their gains inverted with respect to the others of said filters when combined, said filters each having approximately the same gain with the exception of said filters represented by the outside poles on said line parallel to the imaginary axis, said outside poles having gains approximately one-half of the remaining poles.

4. A band-pass filter comprising a plurality of active filters, each of said filters having related resonating frequency and damping characteristics, said resonating frequency and damping characteristics for each of said filters causing all of the poles of said filters to be along a line parallel to the imaginary axis of the S plane, means connected to the outputs of said filters so that the output signals of said filters are combined, with alternate ones of said filters having their gain inverted with respect to the other of said filters when combined, the poles representative of said filters being equally spaced with the exception of end poles which are spaced approximately one-half the distance of the next adjacent poles.

* * * * *